United States Patent
Kim (10) Patent No.: US 6,989,700 B2
(45) Date of Patent: Jan. 24, 2006

(54) DELAY LOCKED LOOP IN SEMICONDUCTOR MEMORY DEVICE AND ITS CLOCK LOCKING METHOD

(75) Inventor: Kyung-Hoon Kim, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/882,488

(22) Filed: Jun. 30, 2004

(65) Prior Publication Data

US 2005/0195004 A1 Sep. 8, 2005

(30) Foreign Application Priority Data

Mar. 5, 2004 (KR) .................. 10-2004-0014910

(51) Int. Cl.
*H03L 7/06* (2006.01)
(52) U.S. Cl. .................. 327/158; 327/149; 327/142
(58) Field of Classification Search .................. None
See application file for complete search history.

(56) References Cited

U.S. PATENT DOCUMENTS

| | | | |
|---|---|---|---|
| 5,977,801 A | 11/1999 | Boerstler | |
| 6,018,259 A * | 1/2000 | Lee | 327/159 |
| 6,060,928 A | 5/2000 | Jun et al. | |
| 6,212,126 B1 | 4/2001 | Sakamoto | |
| 6,242,954 B1 * | 6/2001 | Taniguchi et al. | 327/149 |
| 6,262,608 B1 * | 7/2001 | O'Hearcain et al. | 327/142 |
| 6,281,728 B1 | 8/2001 | Sung | |
| 6,316,976 B1 | 11/2001 | Miller, Jr. et al. | |
| 6,480,033 B1 | 11/2002 | Shinozaki | |
| 6,828,835 B2 * | 12/2004 | Cho | 327/158 |
| 6,919,745 B2 * | 7/2005 | Lee et al. | 327/158 |
| 2002/0027451 A1 | 3/2002 | Shinozaki | |
| 2002/0130691 A1 | 9/2002 | Silvestri | |
| 2002/0154718 A1 | 10/2002 | Fong et al. | |
| 2003/0210578 A1 | 11/2003 | Park | |

FOREIGN PATENT DOCUMENTS

JP 2003-242779 8/2003

* cited by examiner

*Primary Examiner*—Timothy P. Callahan
*Assistant Examiner*—Cassandra Cox
(74) *Attorney, Agent, or Firm*—Blakely Sokoloff Taylor & Zafman (57) ABSTRACT

A delay locked loop (DLL) for generating a delay locked clock signal, including: a comparator enable signal generator for generating a comparator enable signal in response to a reset signal and a plurality of clock divided signals; a semi locking detector for generating a semi locking detection signal in response to the comparator enable signal; a phase comparator enabled by the comparator enable signal for receiving a rising edge clock signal and a feed-backed clock signal in order to compare phases of the rising edge clock signal and the feed-backed clock signal and output the comparison result; and a DLL generator for generating the delay locked clock signal in response to the comparison result, wherein the comparator enable signal is generated by enlarging a pulse width of the reset signal by a predetermined amount.

9 Claims, 9 Drawing Sheets

DELAY LOCKED LOOP IN SEMICONDUCTOR MEMORY DEVICE AND ITS CLOCK LOCKING METHOD

FIELD OF INVENTION

The present invention relates to a delay locked loop (DLL); and, more particularly, to a DLL capable of being initialized stably in response to a reset signal.

DESCRIPTION OF PRIOR ART

Generally, a clock signal of a system or a circuit is used as a reference for synchronizing an execution timing and guaranteeing an error-free high speed operation.

When an external clock signal is inputted to a semiconductor memory device to be used as an internal clock signal, a clock skew is generated between the external clock signal and the internal clock signal because the external clock signal is delayed while it is inputted to the semiconductor memory device. Therefore, various devices have been introduced to synchronize the internal clock signal with the external clock signal.

For example, a phase locked loop (PLL) and a delay locked loop (DLL) have been developed in order to synchronize the internal clock signal with the external clock signal.

However, since the DLL is less influenced by a noise than the PLL, the DLL is widely used in a synchronous semiconductor memory such as a synchronous dynamic random access memory (SDRAM) or a double data rate (DDR) SDRAM.

Figure 1:
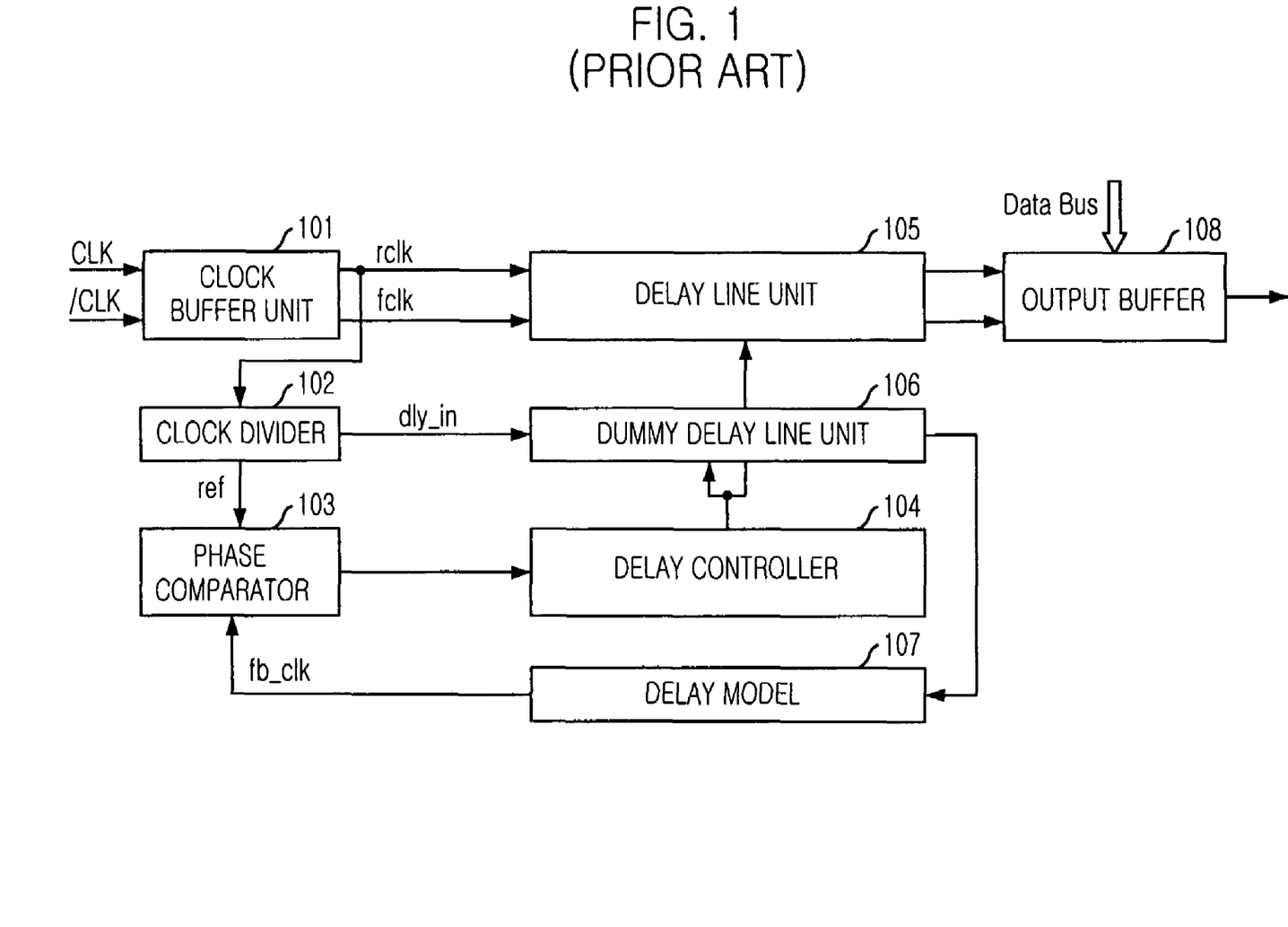
FIG. 1 is a block diagram showing a conventional DLL included in a conventional DDR SDRAM.

FIG. 1 is a block diagram showing a conventional DLL included in a conventional DDR SDRAM.

As shown, the conventional DLL includes a clock buffer unit 101, a clock divider 102, a phase comparator 103, a delay controller 104, a delay line unit 105, a dummy delay line unit 106, a delay model 107 and an output buffer 108.

The clock buffer unit 101 receives an external clock signal CLK and an inverted signal of the external clock signal CLK, i.e., an external clock bar signal /CLK, to generate a rising edge clock signal rclk and a falling edge clock signal fclk by buffering the external clock signal CLK and the external clock bar signal /CLK.

A clock divider 102 receives the rising edge clock signal rclk to generate a reference clock signal ref and a delay monitoring clock signal dly_in by dividing the rising edge clock signal rclk by N. Herein, the N is a natural number.

The phase comparator 103 receives the reference clock signal ref and a feed-backed clock signal fb_clk outputted from the delay model 107 and compares a rising edge of the feed-back clock signal fb_clk with that of an inverted signal of the reference clock signal ref, i.e., a reference clock bar signal /ref, for outputting the comparison result to the delay controller 104.

The delay controller 104 controls delay amounts of the delay line unit 105 and the dummy delay line unit 106 based on the comparison result of the phase comparator 103.

The delay line unit 105 receives the rising and falling edge clock signals rclk and fclk to delay the received signals for a predetermined delay time. Herein, as above mentioned, the predetermined delay time is controlled by the delay controller 104 based on the comparison result of the phase comparator 103.

Likewise, the dummy delay line unit 106 receives the delay monitoring clock signal dly_in and delays the delay monitoring clock signal for a predetermined delay time. Herein, as above mentioned, the predetermined delay time is controlled by the delay controller 104 based on the comparison result of the phase comparator 103. A structure of the dummy delay line unit 106 is the same as that of the delay line unit 105, but the dummy delay line unit 106 consumes less power than the delay line unit 105 because the dummy delay line unit 106 receives a clock-divided signal, i.e., the delay monitoring clock signal dly_in.

The delay model 107 delays an output signal of the dummy delay line unit 106 to output the feed-backed clock signal fb_clk. Herein, a delay amount of the delay model 107 is the same as a delay amount generated while the external clock signal CLK is passed through the conventional DLL to be outputted by the output buffer 108.

The output buffer 108 outputs data in synchronization with outputted clock signals from the delay line unit 105.

Figure 2:
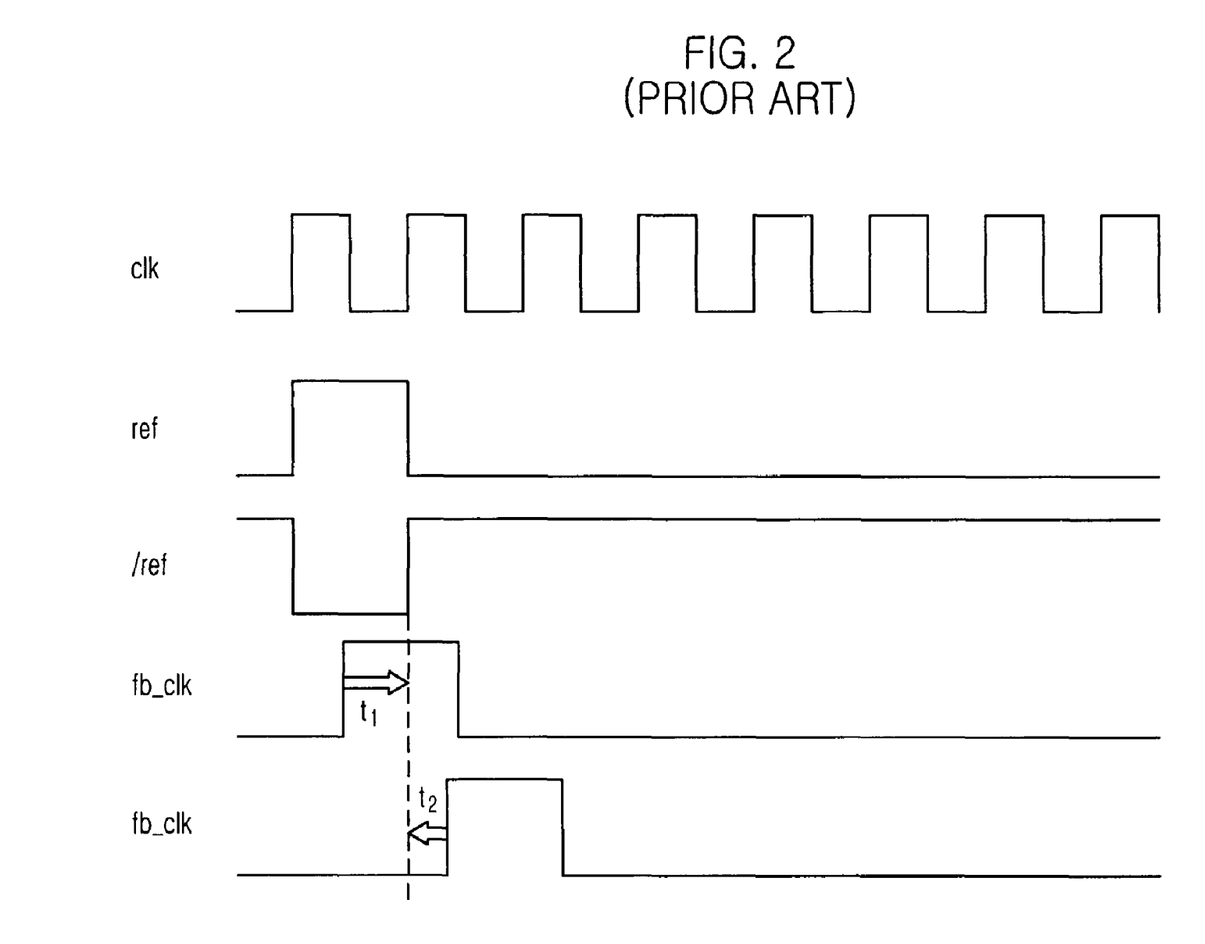
FIG. 2 is a timing diagram showing an operation of a conventional DLL shown in FIG. 1.

FIG. 2 is a timing diagram showing an operation of the conventional DLL.

If the feed-backed clock signal fb_clk and the reference clock signal ref are inputted to the phase comparator 103, the phase comparator 103 compares a rising edge of the feed-backed clock signal fb_clk with that of the reference clock bar signal /ref. As above mentioned, based on the comparison result of the phase comparator 103, delay amount of the delay line unit 105 and the dummy delay line unit 106 are controlled.

If an operational frequency of the conventional DLL is low, at an initial state, a rising edge of the feed-backed clock signal fb_clk leads a rising edge of the reference clock bar signal /ref by a time period $t_1$. Therefore, the feed-backed clock signal fb_clk should be delayed for the time period $t_1$ to be synchronized with a rising edge of the reference clock bar signal /ref and, thus, the delay controller 104 increases delay amounts of the delay line unit 105 and the dummy delay line unit 106.

On the other hand, if the operational frequency of the conventional DLL is high, at the initial state, a rising edge of the feed-backed clock signal fb_clk lags behind a rising edge of the reference clock bar signal /ref by a time period $t_2$. Therefore, delay amounts of the delay line unit 105 and the dummy delay line unit 106 should be decreased by a time period $t_2$.

However, at the initial state, delay amounts of the delay line unit 105 and the dummy delay line unit 106 are respectively set to be the minimum delay amount. Therefore, rising edges of the reference clock bar signal /ref and the feed-backed clock signal fb_clk can not be synchronized. That is, the time period $t_2$ between rising edges of the reference clock bar signal /ref and the feed-backed clock signal fb_clk can not be compensated by controlling delay amounts of the delay line unit 105 and the dummy delay line unit 106. As a result, because of a clock skew which is not compensable, the compensable the conventional DLL can not generate a delay locked clock signal.

In addition, the conventional DLL is reset by a reset signal inputted from an external chipset. The reset signal is inputted to the clock divider 102 and resets the clock divider 102 and the delay controller 104.

However, since a pulse width of the reset signal is narrow, an operation for resetting the conventional DLL may not be performed stably. That is, if the reset signal is inputted to the conventional DLL, the phase comparator 103 should not be operated because the reference clock bar signal /ref and the feed-backed clock signal fb_clk inputted to the phase comparator 103 are not generated. However, if the feed-backed clock signal fb_clk may be generated due to the narrow pulse width of the reset signal, the phase comparator 103 may be operated abnormally.

In addition, the conventional DLL includes the clock divider 102 for providing clock signals, i.e., the delay monitoring clock signal dly_in and the reference clock signal ref. The delay monitoring clock signal dly_in and the reference clock signal ref are respectively inputted to the dummy delay line 105 and the phase comparator 103. Since the reference clock signal ref is a divided signal of the rising edge clock signal rclk, a frequency of the reference clock signal ref is lower than that of the rising edge clock signal rclk. Therefore, a frequency of performing the phase comparison operation of the phase comparator 103 is decreased. The above mentioned operation of the phase comparator 103 may be suitable at a low operational frequency. However, the conventional DLL is not suitable for a semiconductor memory device operated at a high operational frequency because at the high operational frequency, the phase comparison operation should be more frequently performed.

SUMMARY OF INVENTION

It is, therefore, an object of the present invention to provide a DLL capable of preventing a clock skew, which is not compensable, from being generated, which is stably operated at a high operational frequency and performs a reset operation stably.

In accordance with an aspect of the present invention, there is provided a delay locked loop (DLL) for generating a delay locked clock signal, including: a comparator enable signal generator for generating a comparator enable signal in response to a reset signal and a plurality of clock divided signals; a semi locking detector for generating a semi locking detection signal in response to the comparator enable signal; a phase comparator enabled by the comparator enable signal for receiving a rising edge clock signal and a feed-backed clock signal in order to compare phases of the rising edge clock signal and the feed-backed clock signal and output the comparison result; and a DLL generator for generating the delay locked clock signal in response to the comparison result, wherein the comparator enable signal is generated by enlarging a pulse width of the reset signal by a predetermined amount.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a delay locked loop (DLL) for use in a semiconductor memory device in accordance with the present invention will be described in detail referring to the accompanying drawings.

Figure 3:
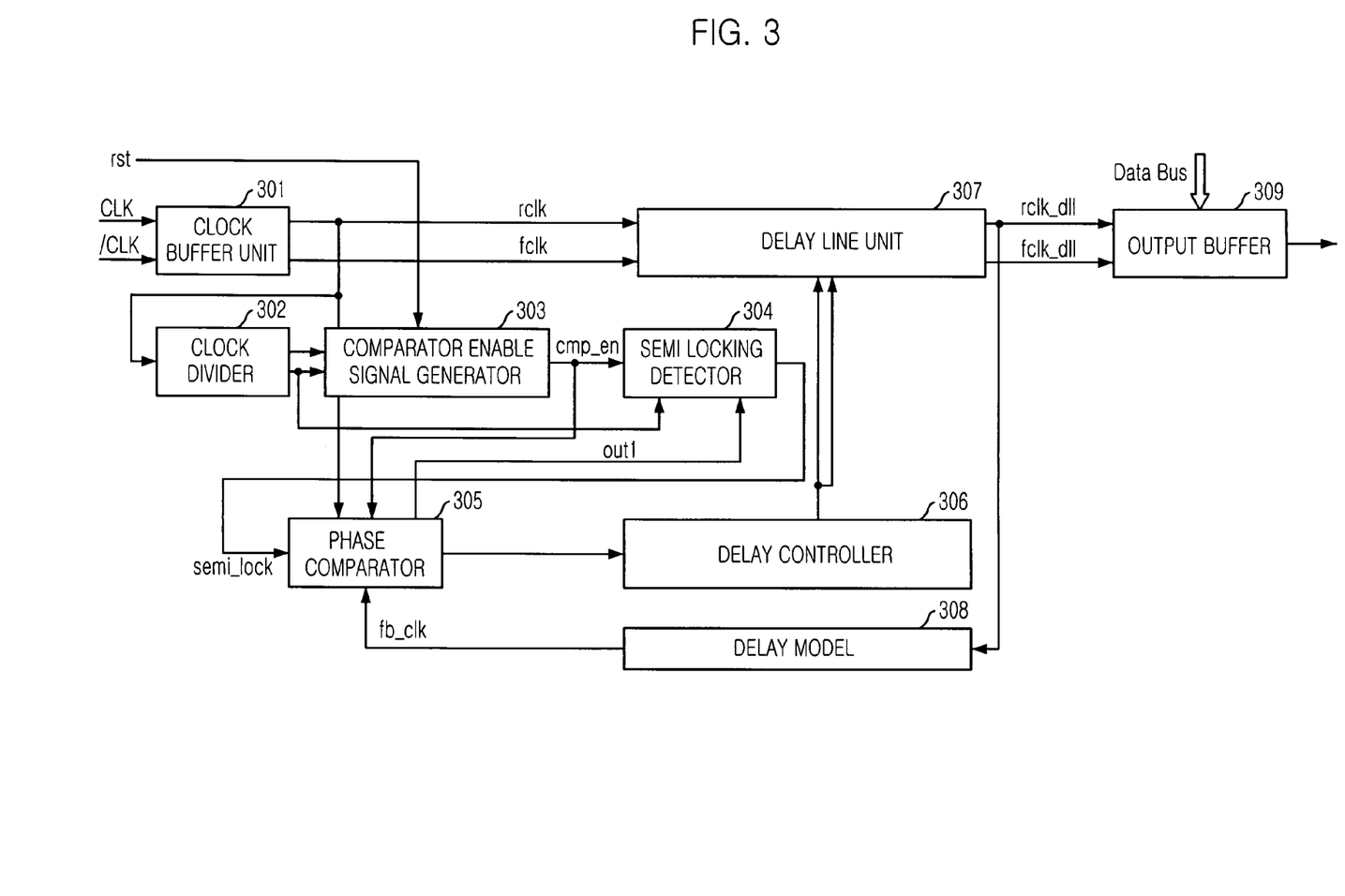
FIG. 3 is block diagram showing a DLL in accordance with a preferred embodiment of the present invention.

FIG. 3 is block diagram showing a delay locked loop (DLL) in accordance with a preferred embodiment of the present invention.

As shown, the DLL includes a clock buffer unit 301, a clock divider 302, a comparator enable signal generator 303, a semi locking detector 304, a phase comparator 305, a delay controller 306, a delay line unit 307, a delay model 308 and an output buffer 309.

The clock buffer unit 301 receives an external clock signal CLK and an inverted signal of the external clock signal CLK, i.e., an external clock bar signal /CLK in order to generate a rising edge clock signal rclk and a falling edge clock signal fclk by buffering the external clock signal CLK and the external clock bar signal /CLK.

The clock divider 302 receives the rising edge clock signal rclk to generate a first to a third clock divided signals clk_v4_p1, clk_v4_p2 and clk_v8. The first and the second clock divided signals clk_v4_p1 and clk_v4_p2 are generated by dividing the rising edge clock signal rclk by 4; the third clock divided signals clk_v8 is generated by dividing the rising edge clock signal rclk by 8.

Herein, each clock cycle of the first and the second clock divided signals clk_v4_p1 and clk_v4_p2 is equal to four clock cycles of the external clock signal CLK. The first and the second clock divided signals clk_v4_p1 and clk_v4_p2 are in a logic high level during one clock cycle of the external clock signal CLK; and are in a logic low level during three clock cycles of the external clock signal CLK. Likewise, a clock cycle of the third clock divided signal clk_v8 is equal to eight clock cycles of the external clock signal CLK. The third clock divided signal clk_v8 is in a logic high level during one clock cycle of the external clock signal CLK; and is in a logic low level during seven clock signals of the external clock signal CLK.

The comparator enable signal generator 303 receives the second and the third clock divided signals clk_v4_p2 and clk_v8 in order to generate a comparator enable signal cmp_en.

The semi locking detector 304 receives the second clock divided signal clk_v4_p2, the comparator enable signal cmp_en and a comparison signal out1 outputted from the phase comparator 305 in order to generate a semi locking detection signal semi_lock.

The phase comparator 305 receives a feed-backed clock signal outputted from the delay model 308, the rising edge clock signal rclk and the semi locking detection signal semi_lock for generating the comparison signal out1 and a plurality of shift right control signals and shift left control signals, i.e., a first shift right control signal sr1, a second shit right control signal sr2, a first shift left control signal sl1 and a second shit left control signal sl2.

The delay controller 306 controls a delay amount of the delay line unit 307 based on the first and the second shift right control signals sr1 and sr2 and the first and the second shift left signals sl1 sl2.

The delay line unit 307 delays the rising edge clock signal rclk and the falling edge clock signal fclk for a predetermined delay time in order to generate delay locked clock signals, i.e., a delay locked rising edge clock signal rclk_dll and a delay locked falling edge clock signal fclk_dll. Herein, as above mentioned, the predetermined delay time is determined by the delay controller 306 based on the first and the second shift right control signals sr1 and sr2 and the first and the second shift left signals sl1 sl2.

The delay model 308 delays the delay locked rising edge clock signal rclk_dll in order to output the delayed delay locked rising edge clock signal rclk_dll as the feed-backed clock signal fb_clk. Herein, a delay amount of the delay model 308 is the same as a delay amount generated while the external clock signal CLK is passed through the conventional DLL until it is outputted by the output buffer 108.

The output buffer 309 outputs data in synchronization with the delay locked rising and falling edge clock signals rclk_d11 and fclk_d11.

Figure 4:
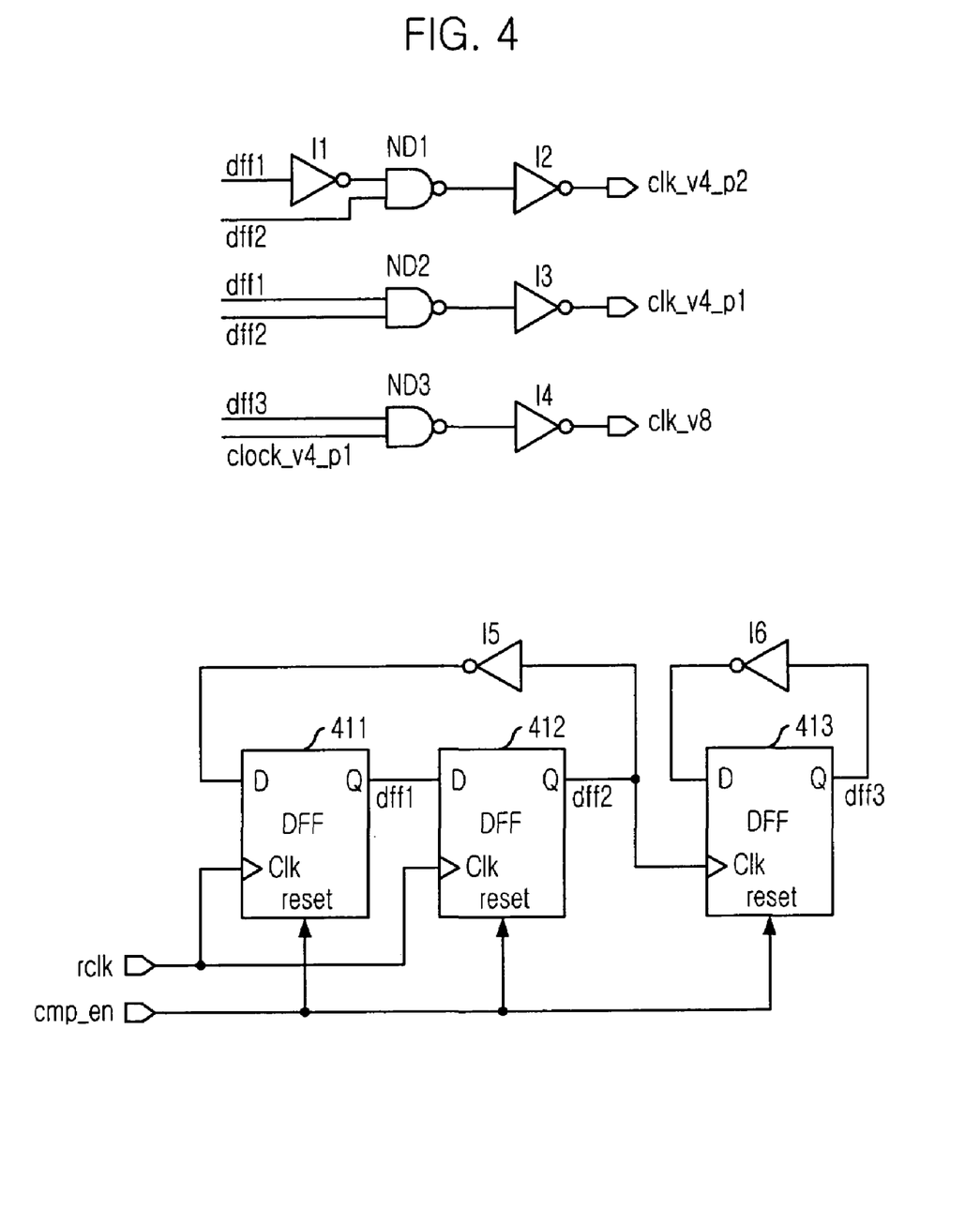
FIG. 4 is a schematic circuit diagram showing a clock divider shown in FIG. 3.

FIG. 4 is a schematic circuit diagram showing the clock divider 302 shown in FIG. 3.

As shown, the clock divider 302 includes a first to a third D-type flip-flops 411 to 413 and a plurality of logic gates, i.e., a first to a sixth inverters I1 to I6 and a first to a third NAND gates ND1 to ND3.

The first and the second D-type flip-flops 411 and 412 receive the rising edge clock signal rclk through their clock input terminals. A data terminal of the first D-type flip-flop receives an output signal of the fifth inverter I5 and outputs a first D-type flip-flop output signal dff1. Herein, an input terminal of the fifth inverter is connected to a output terminal of the second D-type flip-flop 412 and a clock input terminal of the third D-type flip-flop 413.

A data terminal of the second D-type flip-flop 412 receives the first D-type flip-flop output signal dff1 to output a second D-type flip-flop output signal dff2.

A data terminal of the third D-type flip-flop 413 receives a sixth inverter I6 whose input terminal is connected to a output terminal of the third D-type flip-flop 413. The output terminal of the third D-type flip-flop 413 outputs a third D-type flip-flop output signal dff3.

The first inverter I1 inverts the first D-type flip-flop output signal dff1, and the first NAND gate ND1 performs a logic NAND operation to an output signal of the first inverter I1 and the second D-type flip-flop dff2. The second inverter I2 inverts an output signal of the first NAND gate ND1 to output the second clock divided signal clk_v4_p2.

The second NAND gate ND2 performs a logic NAND operation to the first and the second D-type flip-flop output signals dff1 and dff2, and the third inverter I3 inverts an output signal of the second NAND gate ND2 to output the first clock divided signal clk_v4_p1.

Likewise, the third NAND gate ND3 performs a logic NAND operation to the third D-type flip-flop dff3 and the first clock divided signal clk_v4_p1, and the fourth inverter I4 inverts an output signal of the third NAND gate ND3 to output the third clock divided signal clk_v8.

Figure 5:
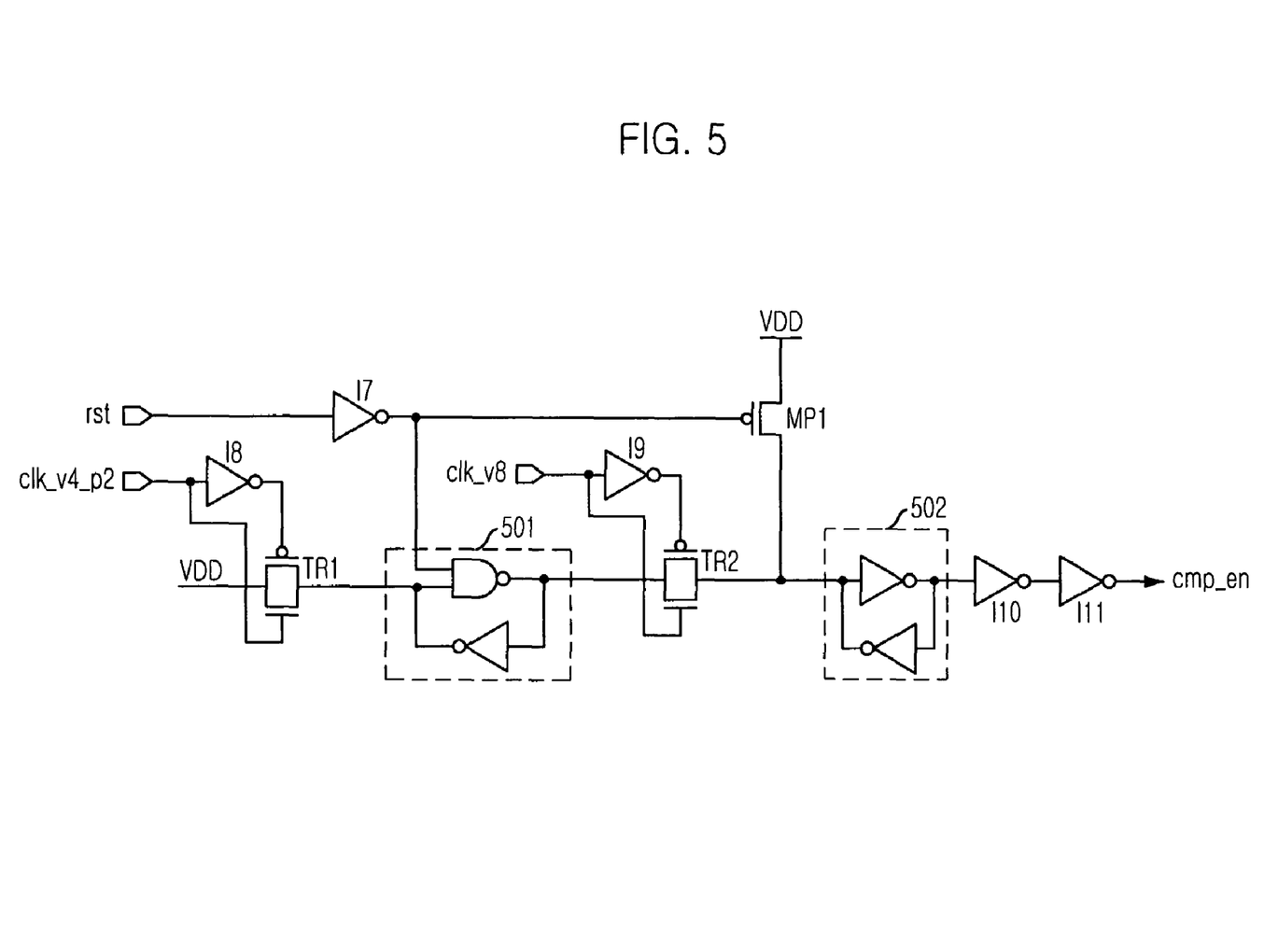
FIG. 5 is a schematic circuit diagram showing a comparator enable signal generator shown in FIG. 3.

FIG. 5 is a schematic circuit diagram showing the comparator enable signal generator 303 shown in FIG. 3.

The comparator enable signal generator 303 generates the comparator enable signal cmp_en by enlarging a pulse width of a reset signal rst.

The comparator enable signal cmp_en is used for the DLL not to be abnormally operated due to a remaining clock signal after the reset signal rst is inputted to the DLL. Herein, the remaining clock signal includes any clock signal of the DLL which is still activated after the reset signal rest is inputted to the DLL. Therefore, a pulse width of the comparator enable signal cmp_en is required to be equal to a delay time generated while a clock signal inputted to the delay line unit 307 is passed through the delay model 308 and the phase comparator 305.

As shown, in detail, the comparator enable signal generator 303 includes a first latch 501, a second latch 502, a seventh to an eleventh inverters I7 to I11, a first transfer gate TR1, a second transfer gate TR2 and a first p-channel metal oxide semiconductor (PMOS) transistor MP1.

If the reset signal rst is inputted to the seventh inverter I7, the first PMOS transistor MP1 is turned-on, and, thus, the comparator enable signal cmp_en becomes in a logic low level.

Thereafter, if the second divided signal clk_v4_p2 turns on the first transfer gate TR1, an output signal of the first latch 501 becomes in a logic high level. Thereafter, the second transfer gate TR2 is turned on by the third divided signal clk_v8, and an output signal of the second latch 502 becomes in a logic high level. As a result, the comparator enable signal cmp_en becomes in a logic high level.

Figure 6:
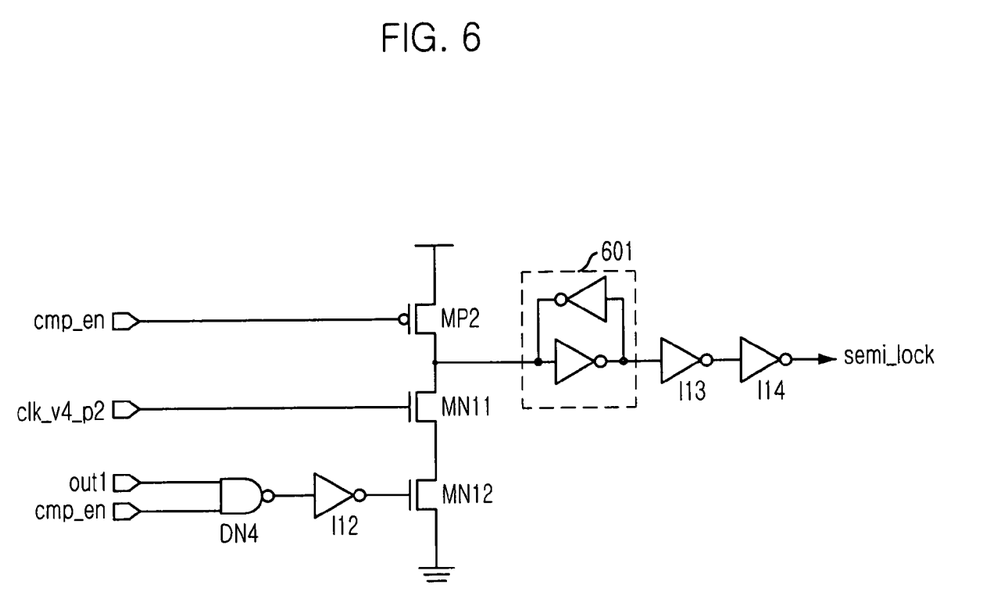
FIG. 6 is a schematic circuit diagram showing a semi locking detector shown in FIG. 3.

FIG. 6 is a schematic circuit diagram showing the semi locking detector 304 shown in FIG. 3.

As shown, the semi locking detector 304 includes a third latch 601, a fourth NAND gate ND4, a second PMOS transistor MP2, a first n-channel metal oxide semiconductor (NMOS) transistor MN1, a second NMOS transistor MN2 and a twelfth to a fourteenth inverters I12 to I14.

If the comparator enable signal cmp_en is in a logic low level, the second PMOS transistor MP2 is turned on and then, the semi locking detection signal semi_lock becomes in a logic low level. Thereafter, if the comparator enable signal cmp_en becomes in a logic low level, the second PMOS transistor MP2 is turned off. Therefore, the semi locking detection signal semi_lock is controlled by the comparison signal out1.

Figure 7:
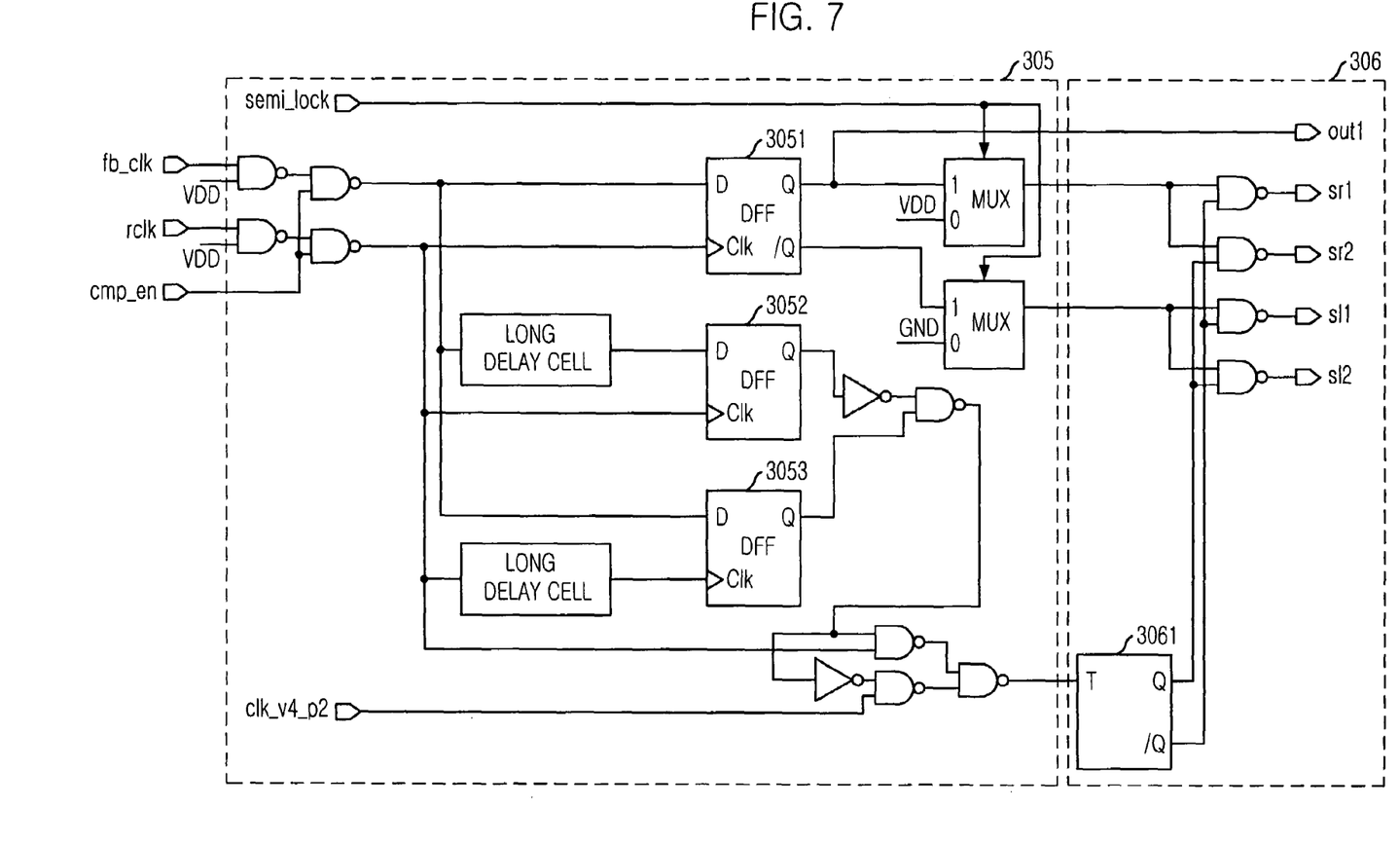
FIG. 7 is a schematic circuit diagram showing a phase comparator and a delay controller shown in FIG. 3.

FIG. 7 is a schematic circuit diagram showing the phase comparator 305 and the delay controller 306.

As shown, the phase comparator 305 includes a fourth to a sixth D-type flip-flops 3051 to 3053, two multiplexers and a plurality of logic gates. The delay controller 306 includes a T-type flip-flop 3061 and a plurality of logic gates.

The phase comparator 305 starts to be operated if the comparator enable signal cmp_en is activated as a logic high level.

The fourth D-type flip-flop 3051 compares rising edges of the rising edge clock signal rclk and the feed-backed clock signal fb_clk in order to determine shift right or shift left rising edges of the rising edge clock signal rclk and the falling edge clock signal fclk in the delay line unit 307. The fifth and the sixth D-type flip-flops 3052 and 3053 determine speed of the shift right or the shit left operation.

That is, if a rising edge of the rising edge clock signal rclk leads a rising edge of the feed-backed clock signal fb_clk, an output signal of the third D-type flip-flop 3051, i.e., the comparison signal out1 becomes in a logic low level. In other words, if a rising edge of the feed-backed clock signal fb_clk lags behind a falling edge of the rising edge clock signal rclk, the comparison signal out1 becomes in a logic high level. Therefore, even though a rising edge of the feed-backed clock signal fb_clk leads a rising edge of the rising edge clock signal, the delay line unit 307 can delay the feed-backed clock signal fb_clk by delaying the rising edge clock signal rclk until a rising edge of the feed-backed clock signal fb_clk lags behind a falling edge of the rising edge clock signal rclk.

Likewise, the fifth D-type flip-flop 3052 compares rising edges of the feed-backed clock signal fb_clk and a delayed rising edge clock signal which is a delay signal of the rising edge clock signal rclk. Also, the sixth D-type flip-flop 3053 compares rising edges of the rising edge clock signal rclk and a delayed feed-backed clock signal which is a delayed signal of the feed-backed clock signal fb_clk.

Figure 8:
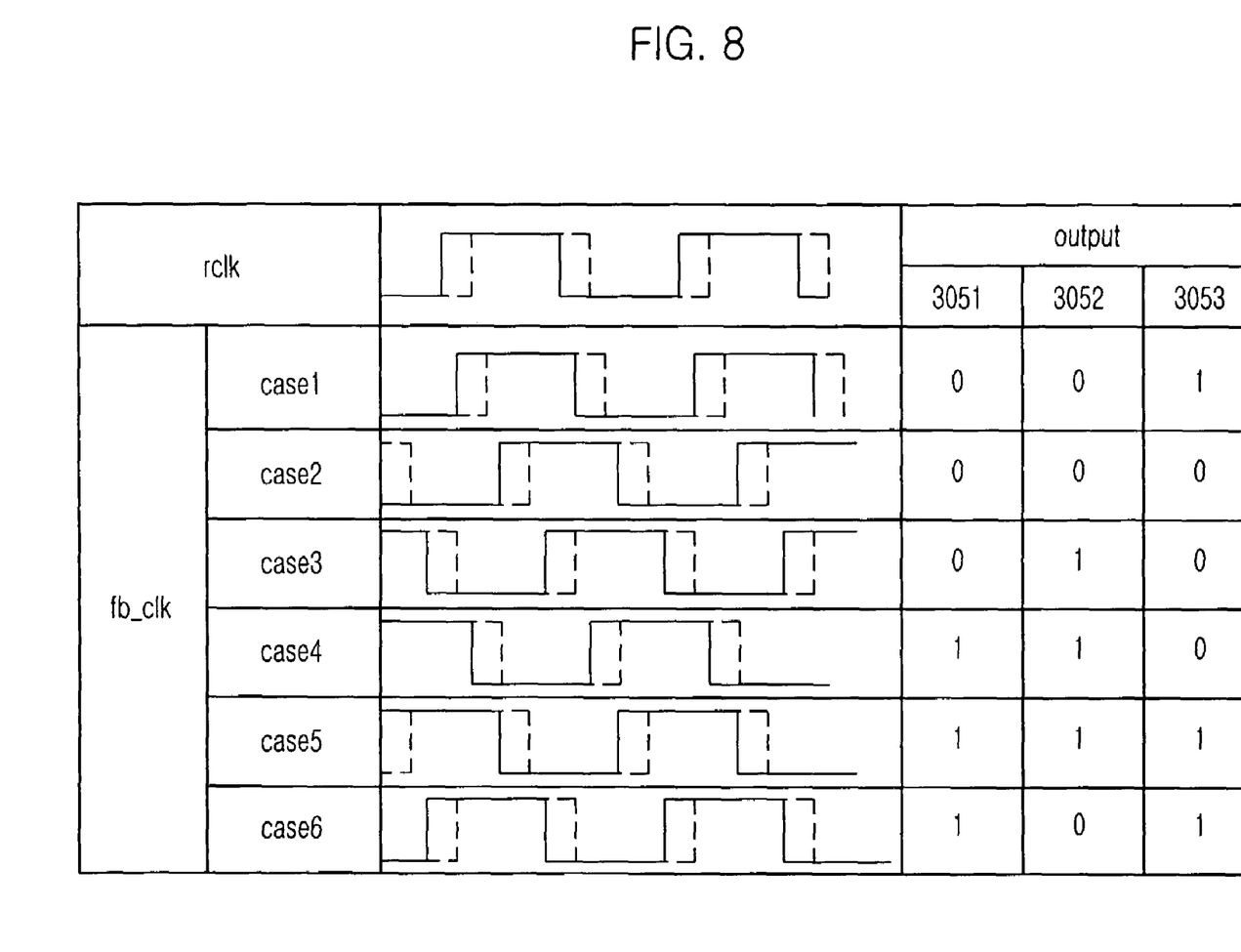
FIG. 8 is a timing diagram showing an operation of a phase comparator shown in FIG. 7.

FIG. 8 is a timing diagram showing an operation of the phase comparator 305 shown in FIG. 7.

As shown in a case 1 and a case 2, i.e., when a gap between a rising edge of the feed-backed clock signal fb_clk and a rising edge of the rising edge clock signal rclk is smaller than a predetermined length, the second divided clock signal clk_v4_p2 is inputted to the T-type flip-flop 3061 in order to slowly shift a phase of the feed-backed clock signal fb_clk. On the other hand, in a case 2, a case 3, a case 4 or a case 5, i.e., when the gap between a rising edge of the feed-backed clock signal fb_clk and a rising edge of the rising edge clock signal rclk is larger than a predetermined length, the rising edge clock signal rclk is inputted the T-type flip-flop 3061 in order to shift a phase of the feed-backed clock signal fb_clk in a fast speed.

Meanwhile, if the semi locking detection signal semi_lock is in a logic low level, the two multiplexers output a power supply voltage VDD and a ground voltage GND. If the semi locking detection signal semi_lock becomes in a logic high level, the two multiplexers transfers output signals of the fourth D-type flip-flop 3051.

Figure 9:
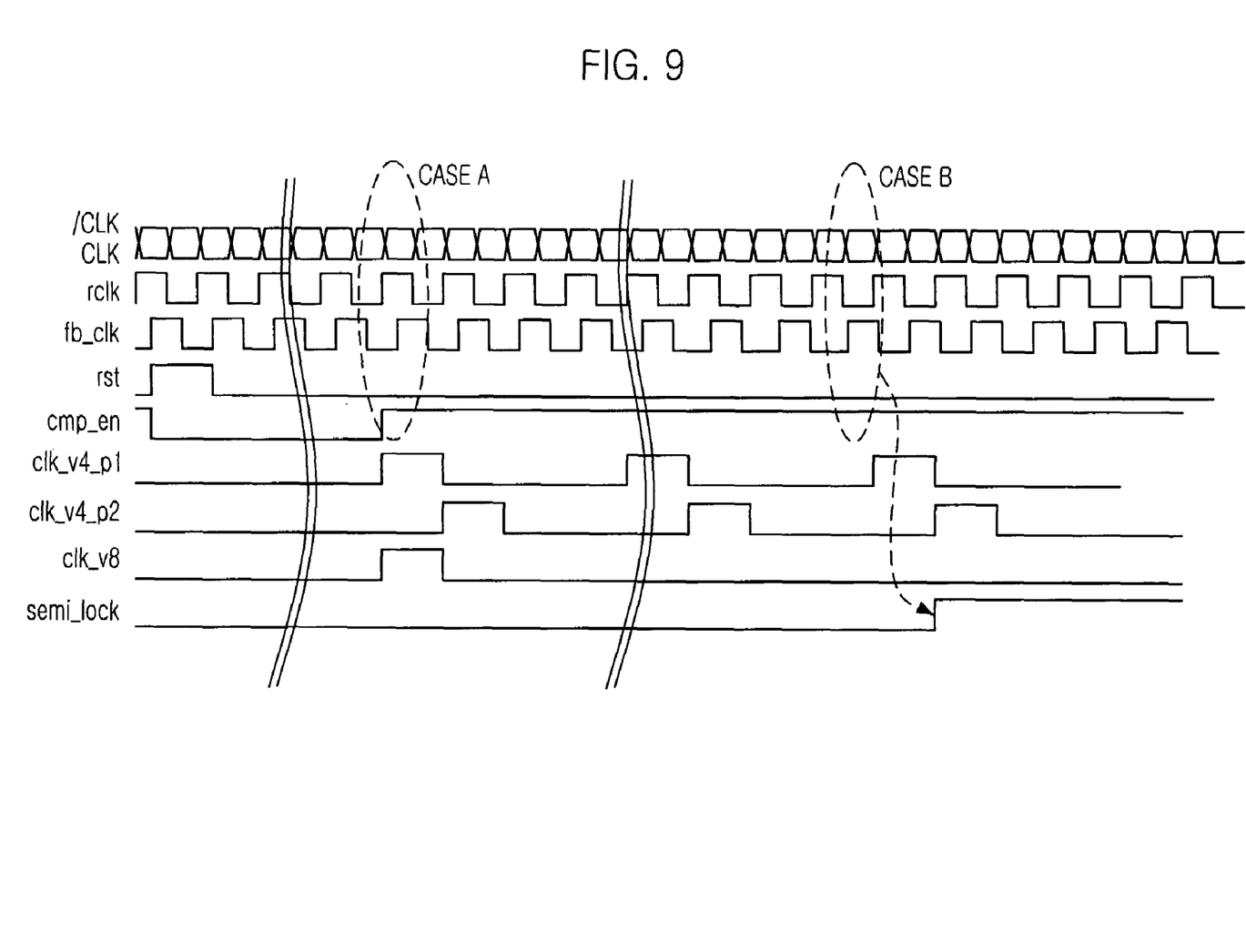
FIG. 9 is a timing diagram showing an operation of a DLL shown in FIG. 3.

FIG. 9 is a timing diagram showing an operation of the DLL.

If the reset signal rst is inputted, the comparator enable signal cmp_en becomes in a logic low level. Therefore, the semi locking detector 304, the delay line unit 307 and the phase comparator 305 are reset while the comparator enable signal cmp_en is in a logic low level, and, thus input signals of the semi locking detector 304, the delay line unit 307 and the phase comparator 305 are ignored while the comparator enable signal cmp_en is in a logic low level. Thereafter, if the comparator enable signal cmp_en becomes in a logic high level, the semi locking detector 304, the delay line unit 307 and the phase comparator 305 is operated normally in response to their input signals.

As described above, the DLL in accordance with the present invention can perform a phase comparison operation at a higher frequency than that of the conventional DLL and also can prevent a clock skew, which is not compensable, from being generated at an initial state of the DLL. In addition, the DLL can perform a reset operation stably without an error and also can reduce a power consumption because the DLL does not include a dummy delay line.

The present application contains subject matter related to Korean patent application No. 2004-14910, filed in the Korean Patent Office on Mar. 5, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A delay locked loop (DLL) for generating a delay locked clock signal, comprising:
    a comparator enable signal generator for generating a comparator enable signal in response to a reset signal and a plurality of clock divided signals;
    a semi locking detector for generating a semi locking detection signal in response to the comparator enable signal;
    a phase comparator enabled by the comparator enable signal for receiving a rising edge clock signal and a feed-backed clock signal in order to compare phases of the rising edge clock signal and the feed-backed clock signal and output the comparison result; and
    a DLL generator for generating the delay locked clock signal in response to the comparison result,
    wherein the comparator enable signal is generated by enlarging a pulse width of the reset signal by a predetermined amount.

2. The DLL as recited in claim 1, wherein the phase comparator outputs the comparison result in response to the semi locking detection signal if the comparator enable signal is activated.

3. The DLL as recited in claim 2, wherein the DLL generator includes:
    a clock buffer which receives an external clock signal for generating the rising edge clock signal and a falling edge clock signal;
    a clock divider for generating the plurality of clock divided signals by dividing the rising edge clock signal;
    a delay line unit for generating the delay locked clock signal by delaying the rising edge clock signal and the falling edge clock signal in response to a plurality of shift right signals and shift left signals;
    a delay line unit controller for generating the plurality of shift right signals and shift left signals; and
    a delay modell which delays the delay locked clock signal for generating the feed-backed clock signal.

4. The DLL as recited in claim 3, wherein the comparator enable signal generator includes:
    a first transfer gate for transferring a power supply voltage in response to one of the plurality of clock divided signals;
    a NAND gate for receiving the reset signal and an output signal of the first transfer gate;
    an inverter which is connected in parallel with the NAND gate;
    a second transfer gate for transferring an output signal of the NAND gate in response to one of the plurality of clock divided signals;
    a latch for outputting the semi locking detection signal which is in the first logic state in response to the reset signal and an output signal of the second transfer gate.

5. The DLL as recited in claim 4, wherein the semi locking detector includes:
    a PMOS transistor for receiving the comparator enable signal;
    a first NMOS transistor which receives one of the plurality of clock divided signals and is connected to the PMOS transistor;
    a logic gate unit for receiving an output signal of the phase comparator and the comparator enable signal;
    a second NMOS transistor for receiving an output signal of the logic gate unit; and
    a latch which latches an output signal of drains of the first NMOS transistor and the PMOS transistor for outputting the semi locking detection signal.

6. The DLL as recited in claim 5, wherein the phase comparator includes:
    a first D-type flip-flop which receives the feed-backed clock signal and the rising edge clock signal in order to determine if shift right or shift left a delay amount of the delay line unit; and
    a second and a third D-type flip-flops which receives the feed-backed clock signal and the rising edge clock signal in order to determine a speed of shifting the delay amount of the delay line unit.

7. The DLL as recited in claim 6, wherein the first D-type flip-flop receives the feed-backed clock signal through a data terminal and receives the rising edge clock signal through a clock input terminal.

8. The DLL as recited in claim 7, wherein the phase comparator further includes a multiplexer for outputting one of the power supply voltage and an output signal of the first flip-flop in response to the semi locking detection signal.

9. The DLL as recited in claim 8, wherein the second D-type flip-flop compares the feed-backed clock signal and a delayed rising edge clock signal, and the third D-type flip-flop compares the rising edge clock signal and a delayed feed-backed clock signal.

* * * * *